United States Patent [19]

Förster et al.

[11] 4,229,476

[45] Oct. 21, 1980

[54] THIN FILM STRUCTURE ON A RIBBON SUBSTRATE FOR ELECTRIC COMPONENTS AND MANUFACTURE THEREOF

[75] Inventors: Herbert Förster, Remshalden; Dieter Bayer, Stuttgart, both of Fed. Rep. of Germany

[73] Assignee: Robert Bosch GmbH, Stuttgart, Fed. Rep. of Germany

[21] Appl. No.: 22,375

[22] Filed: Mar. 20, 1979

Related U.S. Application Data

[63] Continuation of Ser. No. 832,350, Sep. 12, 1977, abandoned.

[30] Foreign Application Priority Data

Sep. 14, 1976 [DE] Fed. Rep. of Germany ....... 2641232

[51] Int. Cl.$^3$ ................................................. B32B 3/10
[52] U.S. Cl. ...................................... 428/201; 427/99; 428/209; 428/211
[58] Field of Search .............. 427/99, 121, 248 J, 427/250, 258, 288, 79, 124, 126, 419 A, 404, 81, 255.7, 419.2; 428/201, 209, 211, 469

[56] References Cited

U.S. PATENT DOCUMENTS

| | | | |
|---|---|---|---|
| 2,482,054 | 9/1949 | Colbert | 428/469 |
| 2,748,031 | 5/1956 | Katig | 428/201 |
| 3,053,698 | 9/1962 | Ogle | 427/404 |
| 3,076,727 | 2/1963 | Harwig | 428/469 |
| 3,152,035 | 10/1964 | Kirschner | 428/201 |

*Primary Examiner*—Evan K. Lawrence
*Attorney, Agent, or Firm*—Frishauf, Holtz, Goodman & Woodward

[57] ABSTRACT

In the manufacture of devices using a metal film deposited on a substrate of paper or synthetic resin sheet or strip material, an advantage has been found with respect to promoting adherence and resisting corrosion, when an intermediate layer is used that does not completely cover the substrate but leaves gaps between covered areas or islands. The top layer, which covers the exposed areas of the substrate and the intermediate layer, is aluminum, zinc, cadmium or zinc-cadmium. The patchy intermediate layer is an oxide or a mixture of oxides of tungsten, lead, antimony, bismuth. Oxides of certain other metals and silicon and boron oxides are also usable. Both the oxide layer and the metal layer can be vapor-deposited on a moving strip of the substrate at a foreign gas pressure of up to 1 torr. in a single pass of the substrate strip through the vacuum chamber. The oxide can be thermally deposited by vaporizing the oxide in question in vacuum or it can be formed by the action of residual oxygen or water vapor on the corresponding atoms of pure metals vaporized in the vacuum for deposition.

4 Claims, No Drawings

THIN FILM STRUCTURE ON A RIBBON SUBSTRATE FOR ELECTRIC COMPONENTS AND MANUFACTURE THEREOF

This is a continuation of application Ser. No. 832,350 filed Sept. 12, 1977, now abandoned.

This invention concerns improved thin film electric circuit components more particularly of the kind in which an intermediate layer of a metal oxide or salt is provided between an insulating substrate and an overlying metal film.

Thin film electric circuit components of the type just mentioned are known, for example from U.S. Pat. No. 2,482,054, in which a continuous intermediate layer co-extensive with the substrate surface in question is provided that is made of a metal compound that improves the adherence of an overlying metal layer as well as its corrosion stability, against the effect of water vapor and other corrosive gases. This disclosure relates to thin film devices of a glass or ceramic type of substrate and the metal compounds named in the publication just mentioned are oxides, sulfides, sulfates, bromides, chlorides, iodides, tungstates and fluorides of metals.

The requirement for a full covering of the substrate with the metal compound that forms the intermediate layer between the substrate and a thin metallic layer was based on the notion that only the molecular forces between the metallic compound and the adjoining substrate surface on one hand and the metal layer on the other were significant for good adhesion and corrosion stability. It has accordingly been thought necessary that the intermediate layer should cover the entire surface of the substrate without gaps.

The production of an intermediate layer of the kind disclosed in U.S. Pat. No. 2,482,054, runs into considerable difficulties in practice. These lie in the first place in the very low vapor pressure of the recommended materials, so that considerable apparatus expense is necessary in order to deposit from vapor a continuous intermediate layer completely covering the substrate. This disadvantage is even more difficult to overcome if the intermediate layer is to be vapor-deposited on a moving ribbon in connection with the depositing of an overlying metal layer, because in such a process the vapor deposition conditions of the two layers differ greatly from each other, which makes it almost impossible to deposit both materials from vapor in one continuous operation; this applies particularly for high ribbon velocities going up to 12 meters per second, such as the rule for metallized capacitor manufacture.

SUMMARY OF THE INVENTION

It is an object of the present invention to provide a cohesive and stable intermediate layer of good adherence in a thin film device supported on a paper or synthetic resin strip, which can be produced with economically justifiable apparatus expense, particularly in the same operation flow as an overlying layer, to accomplish good adhesion promoting and corrosion inhibiting properties for the entire layer combination. In this connection, it is particularly important to provide a layer constitution which lends itself to formation in practice without difficulties is caused by low deposition rates of the metallic compounds, even in deposition on a moving ribbon, without requiring lowering the ribbon speed below an economically tolerable value.

The substrate is only partly covered with the intermediate layer and is covered with an overall metallic top layer which covers the exposed areas of the substrate and is directly deposited on the intermediate film. The material vapor-deposited to form the intermediate layer is an oxide or a mixture of oxides of one or more of the elements: tungsten, lead, antimony, bismuth, aluminum, magnesium, cadmium, chromium, zircon, nickel, cobalt, manganese, molybdenum, indium, titanium, barium, silicon and boron. Oxides or mixed oxides of tungsten, lead, antimony and bismuth, the first four named above, are preferred. In general, the oxides above referred to are metal oxides, because although silicon and boron are not metals, they are sometimes regarded as somewhat metal-like elements.

DETAILED DESCRIPTION

The above-named oxides are particularly advantageous because they are relatively inactive chemically and further because during a self-healing electrical breakdown in a capacitor, they are split into harmless products. In contrast to these oxides, sulfur-containing compounds, such as sulfides and sulfates could produce harmful side effects. Among the metallic oxides, there have proven to be particular advantages for the present invention in the use of those oxides that when directly or indirectly deposited thermally from vapor under a foreign gas pressure of up to 0.1 torr possess a relatively high vapor pressure with regard to the present process. It is the case, for example, with the oxides of tungsten, lead, antimony and bismuth. For example, in combination with zinc layers of the thickness of 100 to 200 Å or of a layer density of 10 to 15 micrograms per square centimeter on paper or synthetic resin ribbons for capacitor manufacture or for electrographic purposes, excellent properties are obtained for metallized film devices according to the invention. The corrosion resistance is high and dielectric substrate tapes provided with the thin film combination of the present invention for the manufacture of capacitors lead to the provision of capacitors permitting higher electric loading without the circular disintegration of the layers observed in earlier types of thin film structures leading to deterioration of the electrical properties of the capacitor. The layer structure of the present invention has the further advantage that when it is used for a capacitor, the regenerative capability is substantially improved because of the thinner layer. In the case of polypropylene sheets or ribbons, nominal field strengths of at least 50 V/$\mu$m may be applied without the occurrence of impermissible changes of the dielectric.

Along with the material saving, there is also a substantial volume reduction, something that is increasingly sought in modern circuit components. Similar conditions and effects also result in the utilization of the invention to make impregnated self-healing capacitors. For metallized electrographic paper, the invention is particularly important because the shelf life of the product that is limited particularly by corrosion effects, is greatly improved; whereas, in the known layer materials, oxidation and corrosion after prolonged storage results in defective spots and patches resulting from incomplete electrographic burnout, yet when the thin film structure of the present invention is used for electrographic paper, trouble-free recording quality is preserved even after long storage, because of the practically unchanged electrical properties of the electrographic paper.

The metal compound layer only incompletely covering a substrate in accordance with the present invention can be produced, instead of by vaporizing the compound, by a reactive method by vapor-depositing the pure metal in the presence of the other reagent necessary to form the compound. An example of such a method of making the intermediate layer is the formation of aluminum oxide islands, thus only partial overlay of the substrate surface, by vapor-depositing aluminum at a sufficiently low vaporization rate; the aluminum atoms will react either during their transport to the substrate surface or on the transport surface with residual oxygen or residual water vapor present in the chamber, to form aluminum oxide or aluminum hydroxide which is adherently precipitated on the surface. This occurs particularly easily at a residual gas pressure between 1 and 0.01 torr., which is a pressure level still suitable, for example, for vapor deposition of zinc on capacitor ribbons and is also a pressure level that helps to avoid an excessive vapor-deposition rate of the aluminum and hence the risk of an excessive supplying of aluminum. The process can similarly be carried out with other oxides of small vapor pressure, for example the oxides of indium, beryllium, nickel and cobalt. Furthermore, it can be advantageous, according to particular requirements or available technical equipment to utilize two or more different metal compounds and/or two or more different metal layer metals in the same thin film structure.

A particularly good adherence stability of the different components of the thin film structure with respect to each other is obtained when there are used metals and metal compounds with the lowest possible misfitting between crystal lattices. For this purpose, it is desirable for the lattice spacings or the unit cell edge lengths to be about the same in magnitude or if one of them is an integral of the other, say two-fold to five-fold. When the lattice misfittings are thus kept small in number and magnitude, the adherence of the different materials to each other and the durability of the metal layer is very good, so that this criterion can be taken account of in the selection of materials for increasing the effectiveness of the product.

The preferred metals for the metallization layer are aluminum, zinc, cadmium and mixtures of zinc and cadmium resulting from concurrent deposition of the two metals.

As mentioned above, mixed oxides of two or more elements can be used for the intermediate layer that incompletely covers the substrate, as well as an oxide of one of the elements above mentioned. Certain mixed oxides may when deposited, be at least in part regarded as double oxides or compounds, since tungsten oxide, molybdenum oxide, titanium oxide, chromium oxide or manganese oxide, and even oxides of lead and antimony, for instance, may react with bivalent or trivalent oxides such as oxides of magnesium, cadmium, barium and aluminum to form respectively tungstates, molybdates, etc. The same is even more true of the oxides of silicon and boron, the only non-metallic oxides known to have any possible application in the making of layers of the present invention. In other words, in applying the concept of reducing lattice misfits between the oxide layer and the metal layer, mixed oxides are likely to be of interest only so far as two or three oxides may join into a single lattice structure, which of course requires at the proportion of the oxides deposited or formed by oxidation in the chamber should be suitable for forming the common lattice, which, as is well known, does not require precisely stoichiometric proportions.

In experiments a thin-film combination was used with good results in which the metallic compound consists of bismuth oxide ($Bi_2O_3$) and the overlying metal layer consists of zinc (Zn). This layer combination can be vapor-deposited in one and the same vessel at a pressure of 0.05 to 0.1 torr and a conveyor belt speed of 6 to 10 m/second, preferably at 8 m/second. In this case the conveyor belt to be exposed to vapor runs over a cooling roller having a surface temperature of about $-5°$ Celsius.

While the conveyor belt lies against the cooling roller, there is vapor-deposited first the metallic compound, which covers the substrate surface only partly. Behind the vaporizer for the metallic compound, at a short spatial offset in the direction of movement of the conveyor belt, there is located a second vaporizer, with which an overall metal layer of zinc is vapor-deposited over the top of the metallic compound. The zinc is vaporized from a crucible that has a temperature of 900 to 1000° Celsius; the coating with the metal compound is in the range of a few ng/cm², the coating with the metal layer amounts to approximately a thousand times the amount of the metal compound coating.

The pressure in the vacuum vessel and the conveyor speed depend essentially upon the installation used. In this case one seeks, on the one hand, to work with as little vacuum as possible, because the evacuation time is then briefer and the necessary pumps are substantially more economical. On the other hand, the vapor deposition rate is higher in the case of a better vacuum and the conveyor belt speed can be increased.

We claim:

1. A thin film electric circuit component having a carrier substrate of insulating material, a film of vapor-deposited oxide on at least one surface of said substrate and a film of metal thereover and having the improvement consisting in that:

said substrate is a ribbon or tape of a material selected from the group consisting of paper and synthetic resin;

said oxide is directly deposited on said substrate in contact therewith and is selected from the group consisting of the oxides of elements aluminum, magnesium, bismuth, antimony, lead, cadmium, tungsten, molybdenum, beryllium, indium, titanium, barium, chromium, zircon, nickel, cobalt, manganese, silicon and boron and mixed oxides of a plurality of said elements;

said metal film is directly deposited on said oxide film wherever the latter covers said substrate and is a film of metal selected from the group consisting of aluminum, zinc, cadmium and mixed zinc and cadmium; and said metal oxide only partly covers, in patches or islands thereon, the surface or surfaces of said substrate on which it is overlain by said metal film, whereas said metal film fully covers said substrate surface or surfaces.

2. A thin film electric electric circuit component as defined in claim 1, in which said oxide is selected from the group consisting of oxides of the metals, tungsten, molybdenum, antimony and bismuth and mixed oxides of a plurality of said metals.

3. A thin film electric circuit component as defined in claim 1, in which said oxide and the metal of said metal film are selected to minimize misfits between the respective crystal lattices.

4. A thin film electric circuit component as defined in claim 3, in which the ratio of the respective lattice spacings or of the edge length of the respective unit cells of said oxide and of the metal of said metal film is an integral ratio in which one of the integers is unity and the other is between 1 and 5 inclusive.

* * * * *

UNITED STATES PATENT AND TRADEMARK OFFICE
CERTIFICATE OF CORRECTION

PATENT NO. : 4,229,476

DATED : October 21, 1980

INVENTOR(S) : Herbert Förster et al

It is certified that error appears in the above—identified patent and that said Letters Patent is hereby corrected as shown below:

In claim 1, column 4, line 57, the word "metal" should be deleted.

Signed and Sealed this

Twenty-sixth Day of May 1981

[SEAL]

Attest:

RENE D. TEGTMEYER

Attesting Officer     Acting Commissioner of Patents and Trademarks